United States Patent [19]

Nishida et al.

[11] Patent Number: 5,338,942

[45] Date of Patent: Aug. 16, 1994

[54] SEMICONDUCTOR PROJECTIONS HAVING LAYERS WITH DIFFERENT LATTICE CONSTANTS

[75] Inventors: Akio Nishida, Misato; Eiichi Murakami, Hachioji; Kiyokazu Nakagawa, Sayama, all of Japan

[73] Assignee: Hitachi, Ltd., Tokyo, Japan

[21] Appl. No.: 90

[22] Filed: Jan. 4, 1993

[30] Foreign Application Priority Data

Jan. 16, 1992 [JP] Japan .................................. 4-005799

[51] Int. Cl.$^5$ .............................................. H01L 29/04
[52] U.S. Cl. ........................................ 257/17; 257/20; 257/197; 257/192; 257/623
[58] Field of Search ................... 257/17, 20, 197, 192, 257/623

[56] References Cited

U.S. PATENT DOCUMENTS

| | | | |
|---|---|---|---|
| 4,999,682 | 3/1991 | Xu et al. ................................ | 257/20 |
| 5,032,893 | 7/1991 | Fitzgerald, Jr. et al. ........... | 257/200 |
| 5,079,616 | 1/1992 | Yacobi et al. ...................... | 257/615 |

Primary Examiner—Robert Limanek
Attorney, Agent, or Firm—Kenyon & Kenyon

[57] ABSTRACT

A semiconductor device comprising a semiconductor crystalline substrate having projections each thereof having an area of 0.01 $\mu m^2$ to 4 $\mu m^2$ or stripe projections each thereof having a width of 0.01 $\mu m$ to 1 $\mu m$ and semiconductor crystalline layers formed on the projections, each of the layers having lattice constants different from those of the semiconductor crystalline substrate preferably by 0.5% or more. The semiconductor device is free of dislocations and thermally stable. The semiconductor device can be fabricated by performing such processes as forming projections on the substrate and forming semiconductor crystalline layers on the projections by molecular beam epitaxy.

8 Claims, 9 Drawing Sheets

SEMICONDUCTOR PROJECTIONS HAVING LAYERS WITH DIFFERENT LATTICE CONSTANTS

BACKGROUND OF THE INVENTION

The present invention relates to a semiconductor device utilizing a heterostructure and a method for fabricating the same.

In order to achieve higher speed operation and improved performance of semiconductor devices, an art to grow crystal of a semiconductor material whose band structure and lattice constants are different from those of the material of the substrate, an art to perform the so-called hetero-epitaxial growth, is attracting considerable attention from various fields. Earlier, intensive studies were made on the art with compound semiconductors of GaAs or the like which have high mobility, and such high-speed elements as modulation doped field effect transistor (MODFET), high electron mobility transistor (HEMT), and hetero-junction bipolar transistor (HBT) were experimentally produced and announced. Quite recently, an art to epitaxially grow, on an Si substrate, such a semiconductor material as $Si_{1-x}Ge_x$ ($0 < x \leq 1$), SiC, and GaAs, which is different from Si in band structure and lattice constant, or fabrication of a device of heterostructure using such an art has been becoming the object of intensive studies in various fields.

When growing crystal of material different from the substrate in lattice constant, there has been a big problem. As an example, a case where a crystal of an $Si_{1-x}Ge_x$ alloy different from Si in band structure and lattice constant is grown on an Si substrate will be considered. Since Si and Ge have different lattice constants, there is produced a lattice mismatch between Si and $Si_{1-x}Ge_x$ alloy and its value varies from 0% to 4% depending on the alloy ratio (x). Since the $Si_{1-x}Ge_x$ alloy film which is crystallized on the Si substrate grows in conformity with the lattice constants of the Si substrate as the base material, it receives compressive stress. This stress gives such merits to the device, in terms of electric property, that increases the band discontinuity between the Si substrate and the $Si_{1-x}Ge_x$ alloy and that decreases the effective mass of holes. However, the heterostructure formed under the described conditions comes into an unstable state. For example, as the $Si_{1-x}Ge_x$ alloy film increases in thickness, dislocations are produced at the interface between the film and Si to relax the lattice mismatch and the characteristics of the device are deteriorated on account of the produced dislocations. The film thickness at which the dislocation is produced is called the critical thickness. Further, since the strain in the grown film is relaxed, the advantageous characteristics of the heterostructure cannot be sufficiently utilized. Even under the condition of the film thickness below the critical thickness, dislocations are produced by a high-temperature process such as heat treatment given to the film, and thereby, the strain in the grown film is relaxed and the film tends to come into a stable state. Therefore, in order to fabricate an element fully exhibiting advantages of the heterostructure, it is essential that a technology to grow crystal for forming a dislocation-free, thermally stabilized, and greatly strained film be established.

A typical example of $Si/Si_{1-x}Ge_x/Si$ HBT making use of a heterostructure is disclosed in IEDM. Tech. Dig., pp. 874-876 (1987). A sectional view of the HBT is shown in FIG. 2. In this case, the base layer 21 of $Si_{0.88}Ge_{0.12}$ with a smaller band gap than Si and the emitter layer 22 of n-type Si were both formed by molecular beam epitaxy, an $SiO_2$ film 26 as a protecting film is formed by CVD (chemical vapor deposition), and the emitter electrode 23, collector electrode 24, and base electrode 25 were formed by vacuum evaporation. Since the base layer 21 of $Si_{0.88}Ge_{0.12}$ is grown with strain on the Si substrate 20, there is produced a band discontinuity of the valence band of 0.1 eV at the junction between the same and the emitter layer 22 of Si. Because of the presence of this band discontinuity of the valence band, injection of holes from the base layer 21 to the emitter layer 22 is suppressed and, hence, high emitter efficiency can be obtained.

In IEEE Dev. Lett. DL-7, pp. 308-310 (1986), there is disclosed an MODFET with a strained SiGe alloy film grown on an Si substrate as the channel layer and making use of two-dimensional hole gas produced in the band discontinuity. A sectional view of the element is shown in FIG. 3. In this element, an $Si_{0.8}Ge_{0.2}$ channel layer 31 and a p-type emitter layer 32 were epitaxially grown in succession on an Si substrate, an $SiO_2$ film 37 was formed as a protecting layer by CVD, and the source electrode 34, gate electrode 35, and drain electrode 36 were formed by vacuum evaporation. Denoted by 33 is a high density p-type Si layer. It is confirmed that this element functions as a MODFET by virtue of two-dimensional hole gas generated in a band discontinuity at a hetero-interface between the $Si_{0.8}Ge_{0.2}$ channel layer 31 and the p-type emitter layer 32. Incidentally, the film thickness of the $Si_{0.8}Ge_{0.2}$ channel layer 31 is set to be below 25 nm which is the critical thickness of the strain-grown film with respect to the Si substrate 30.

In the above described prior art MODFET, since the thickness of the channel layer 31 of $Si_{0.8}Ge_{0.2}$ has been set to be below the critical thickness, the channel layer has not been given a sufficient thickness for functioning as the channel layer, and therefore, there has been a problem for the element to be hindered from making high-speed operation by the scattering of carriers.

Further, in the above prior art HBT and MODFET, it has been unable to increase the alloy ratio x in order to suppress occurrence of dislocations in the hetero-grown film and, accordingly, the value of the band discontinuity at the hetero-interface between the base layer 21 formed of $Si_{0.88}Ge_{0.12}$ and the Si substrate 20 or the hetero-interface between the channel layer 31 formed of $Si_{0.8}Ge_{0.2}$ and the Si substrate 30 has been as low as from 0.1 to 0.15 eV. Because of the low value of the band discontinuity, it has not been possible to accumulate the two-dimensional carrier gas in a high density and to fully obtain meritorious effects of the heterostructure.

In order to increase the value of the band discontinuity and to accumulate two-dimensional carrier gas in high density, there is a method for example to increase the Ge content to 30% or higher so that the the band gap between the layer and the Si substrate is increased. In such case, however, the lattice mismatch exceeds 1% and, hence, the $Si_{1-x}Ge_x$ alloy film exceeds the critical film thickness with respect to the Si substrate so that dislocations are introduced at the interface and the strain is relaxed. On the other hand, when the film thickness is below the critical thickness, there arises a problem that a sufficient thickness as the base layer or the channel layer cannot be obtained.

Further, in either case, there has been a problem that dislocations are introduced into the grown film in the process of device fabrication after the growth of the film, such as heat treatment following the ion implantation.

In Japanese Patent Publication No. 63-503104 (International Publication No. WO 87/06392), a case is disclosed, in which an epitaxial layer having different lattice constants from those of the substrate was formed on the substrate having a fine pattern, and a semiconductor device was fabricated in the epitaxial layer. In this case, the epitaxial layer was formed on pattern plateaus, the maximum size of the plateau being smaller than 200 angstrom units. It is considered very difficult to form one or more elements on such a fine pattern plateau.

SUMMARY OF THE INVENTION

A first object of the present invention is to provide a semiconductor device with a heterostructure arranged to be free of dislocation and thermally stable, to have a large lattice mismatch, and to have a semiconductor crystalline film with a sufficient film thickness for achieving high-speed operation of the element.

A second object of the present invention is to provide a method for fabricating such a semiconductor device.

In order to achieve the first object, the semiconductor device according to the present invention comprises a semiconductor crystalline substrate having mesas thereon each of which has an area between 0.01 $\mu m^2$ and 4 $\mu m^2$ or stripe mesas each of which has a width between 0.01 $\mu m$ and 1 $\mu m$ and semiconductor crystalline layers, with different lattice constants from those of the semiconductor crystalline substrate, formed on the mesas.

In order to achieve the second object, the method for fabricating the semiconductor device of the present invention comprises the steps of forming mesas each of which has an area between 0.01 $\mu m^2$ and 4 $\mu m^2$ or stripe mesas each of which has a width between 0.01 $\mu m$ and 1 $\mu m$ on a semiconductor crystalline substrate and growing a semiconductor crystalline layer having different lattice constants from those of the semiconductor crystalline substrate at least on the mesas.

It is preferred that the difference between the lattice constants of the semiconductor crystalline layer and the lattice constants of the semiconductor crystalline substrate is between 0.5% and 20%. As for the height of the mesa, it is sufficient if it is larger than the thickness of the semiconductor crystalline layer grown thereon. It may preferably be below 10 $\mu m$. The thickness of the grown semiconductor crystalline layer is preferred to be between the thickness of one atomic layer (approximately 1 nm) and 10 $\mu m$. Further, the semiconductor crystalline layer may be of a strained-layer super lattice structure formed of two or more kinds of semiconductors. In this case, the difference between the average value of the lattice constants of the two or more kinds of semiconductors constituting the strained-layer super lattice structure and the lattice constants of the semiconductor crystalline substrate is preferred to be 0.5% to 20%. It may be more preferable that the difference is between 1% and 20%.

In the method for fabricating the above semiconductor device, it is preferred that molecular beam epitaxy is used in the crystal growing process.

Schematically showing an example of a single crystalline substrate having a grown crystal layer thereon in FIG. 1, the present invention will be described below. A single crystalline substrate 10 is formed in advance so as to have projections and depressions and, then, a semiconductor film different in band structure and lattice constant is grown to crystallize thereon. The single crystalline film 11 on the projection separated from the single crystalline film 12 on the depression by the steep sides of the projection is used as the active layer of the semiconductor device.

The projection in the present invention may be such a portion as a type of mesa obtained by etching away surrounding portions of a desired portion on the substrate, or such a portion surrounded by trenches formed in the substrate that will be seen as a projection from the bottom of the trenches. Further, the semiconductor crystalline substrate having projections may be such that is provided with the projections as described above or such that is provided with the projections as described above formed in a crystalline layer deposited on the single crystalline substrate. In the latter case, the lattice constants for comparison are the lattice constants of the crystalline layer in which the projections are provided.

Operation of the present invention will be described below taking as an example a case where a heterostructure was formed by growing crystal of an $Si_{1-x}Ge_x$ alloy film on an Si substrate. Prior to the crystal growing, the Si substrate was formed into a rectangular projection-and-depression type and, then, an $Si_{0.8}Ge_{0.2}$ alloy film was crystallized to a thickness of 150 nm. In this case, the lattice mismatch was approximately 1% and the film thickness was greatly exceeding the critical thickness.

The relationship between linear dislocation density in the $Si_{0.8}Ge_{0.2}$ alloy film and the mesa size is quantitatively shown in FIG. 4. Here, the linear dislocation density is obtained by taking inverse number of the distance between misfit dislocations. It is known from this figure that the linear density of dislocations in the $Si_{0.8}Ge_{0.2}$ alloy film decreased with decrease in the width of the stripe mesa or the side of the square mesa and the decreasing tendency of the density was remarkable where the length of one side of the mesa was below 10 $\mu m$. Further, it is known that, when the width of the stripe projection was below 1 $\mu m$, the hetero-film grown thereon became completely free of dislocation, and when the area of the square projection was made smaller that 4 $\mu m^2$, the hetero-film grown thereon also became completely free of dislocation.

The variations in the critical thickness when the value of the lattice mismatch was changed are shown in FIG. 5. When the film had approximately 1% of the lattice mismatch between the same and the substrate, the critical thickness of the film grown all over the substrate was 30 nm but the critical thickness was increased to five times as large as that when the film was grown on a square mesa one side of which was 1 $\mu m$. It is known that, by using the method of the present invention, a single crystalline film having a large lattice mismatch could be grown thicker than that in the conventional method to grow crystal all over the substrate, and that free of dislocation.

A specimen produced according to the method of the present invention was annealed, and variations in the linear dislocation density with changes in the annealing temperature were investigated. The results of the investigation are shown in FIG. 6. The linear dislocation density before the annealing was given was approximately 10000/cm when the film was grown all over the substrate and approximately 0/cm when the film was grown on a square mesa with one side being 2 μm long. In the case where the film was crystallized all over the Si substrate, the dislocation density increased with increase in the annealing temperature. After an annealing at 900° C., the dislocation density became approximately double the value before the annealing. On the other hand, in the case where the film was crystallized on an Si substrate with mesas whose one side was 2 μm long, it is found that the linear dislocation density showed virtually no variation with changes in the annealing temperature. The results indicate that the film grown on a small island-like region has a thermally stable state immediately after the crystal growth. This fact will be accounted for as follows.

When the crystal is grown according to the method of the present invention, the grown $Si_{0.8}Ge_{0.2}$ film on the projection and that on the depression are completely spatially isolated from each other. Therefore, an $Si_{0.8}Ge_{0.2}$ film has no misfit dislocation extended from misfit dislocations produced in the $Si_{0.8}Ge_{0.2}$ films on the other projections or on the depressions. Further, from the fact that no dislocation is produced in the film subjected to an annealing when the area of the projection is decreased, it is considered that the production of misfit dislocations is suppressed by reduced stress in the film. By growing crystal using the method of the present invention, a heterostructure film which is thermally stable and free of dislocation can be formed. Although strain of the grown film becomes smaller, the Ge proportion in the alloy can be increased, and therefore, a sufficiently large band discontinuity can be obtained.

DETAILED DESCRIPTION OF THE PREFERRED EMBODIMENTS

EMBODIMENT 1

Figure 1:
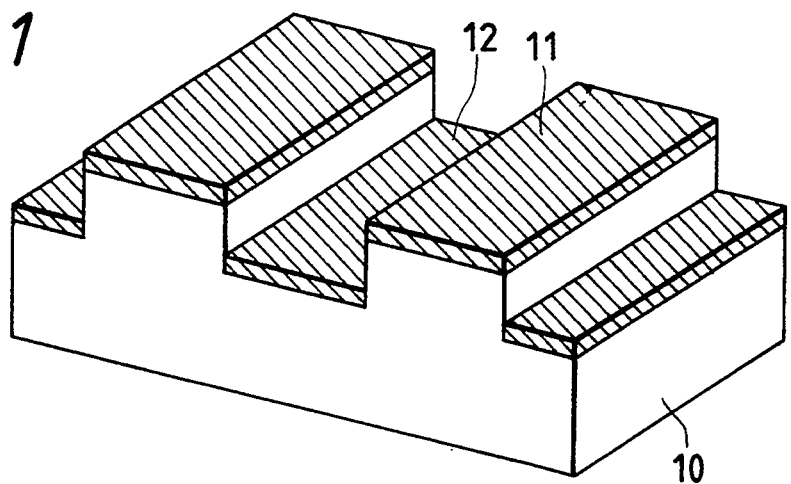
FIG. 1 is a schematic diagram of a heterostructure grown by using the present invention.
Figure 2:
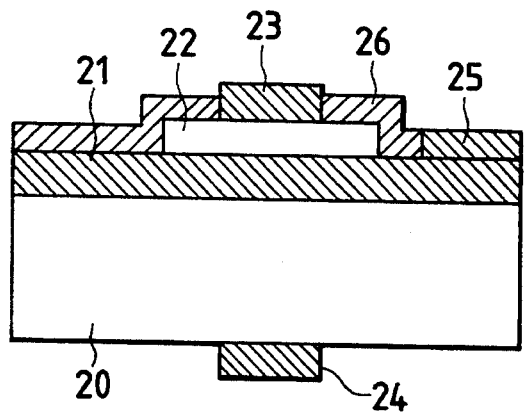
FIG. 2 is a sectional view of a conventional heterojunction bipolar transistor.
Figure 3:
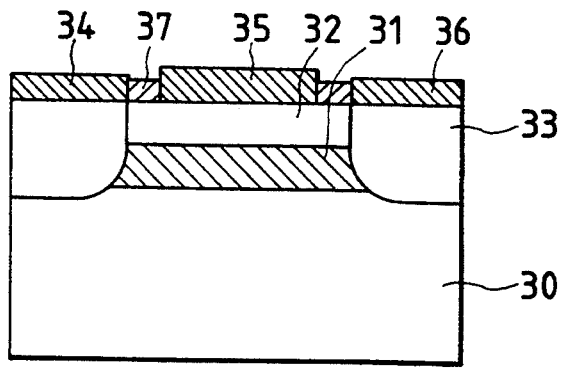
FIG. 3 is a sectional view of a conventional modulation doped field effect transistor.
Figure 4:
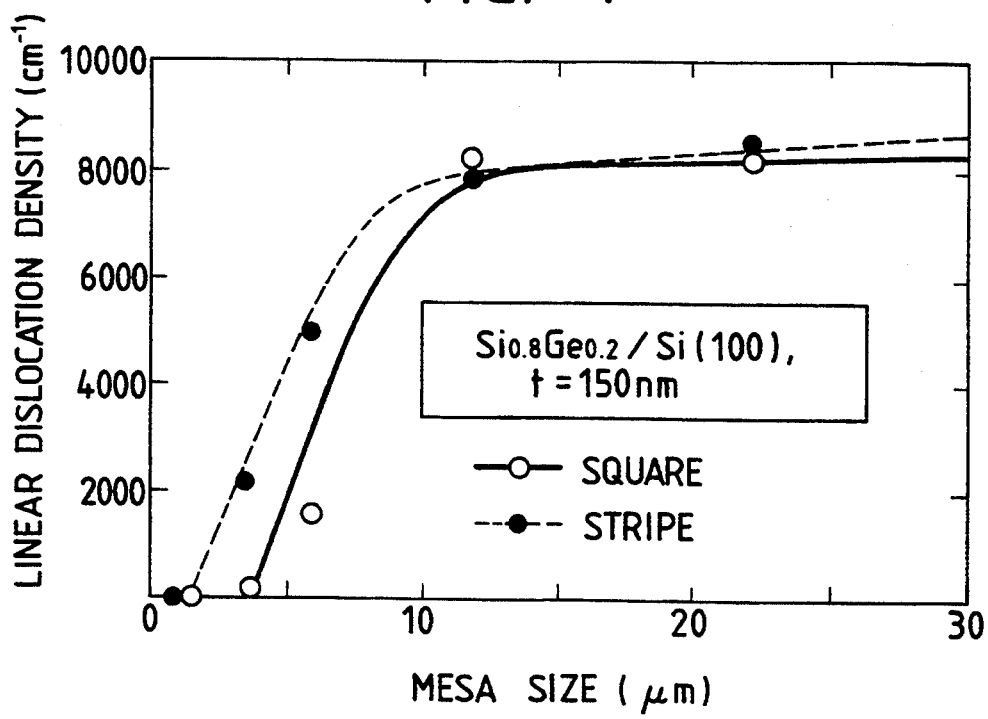
FIG. 4 is a diagram showing the relationship between the linear dislocation density in the $Si_{0.8}Ge_{0.2}$ film on an Si substrate formed so as to have mesas thereon and the size of the mesa.
Figure 6:
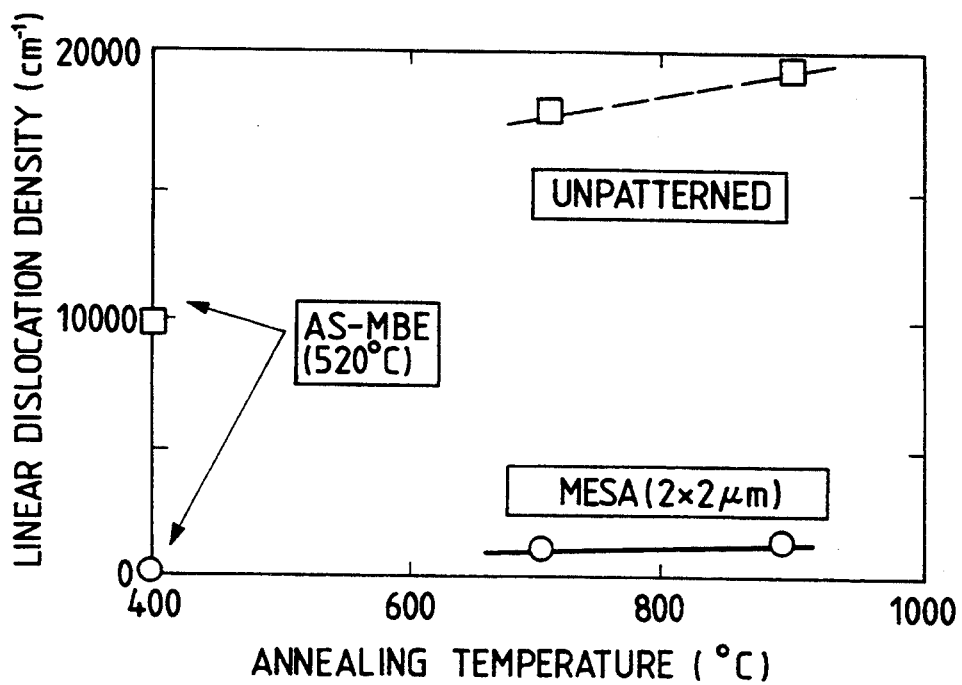
FIG. 6 is a diagram showing the relationship between the linear dislocation density in an $Si_{0.8}Ge_{0.2}$ film deposited on an Si substrate formed so as to have mesas thereon and the annealing temperature.
Figure 5:
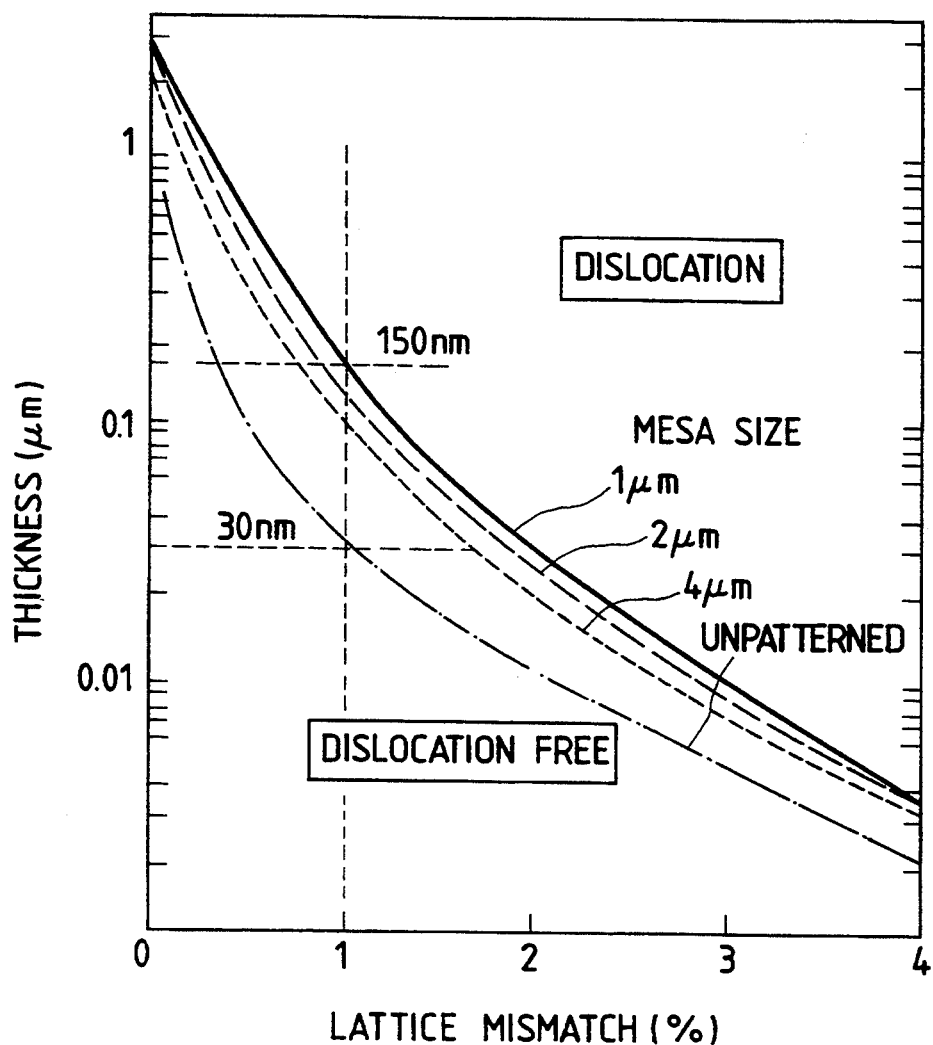
FIG. 5 is a diagram showing the relationship between the critical thickness of an $Si_{0.8}Ge_{0.2}$ film deposited on an Si substrate formed so as to have mesas thereon and the lattice mismatch in the film.
Figure 7A:
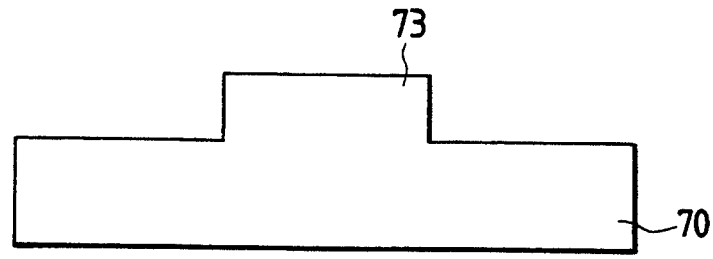
FIG. 7a to FIG. 7c are diagrams showing a fabrication process of an SiGe MODFET according to the present invention.
Figure 7B:
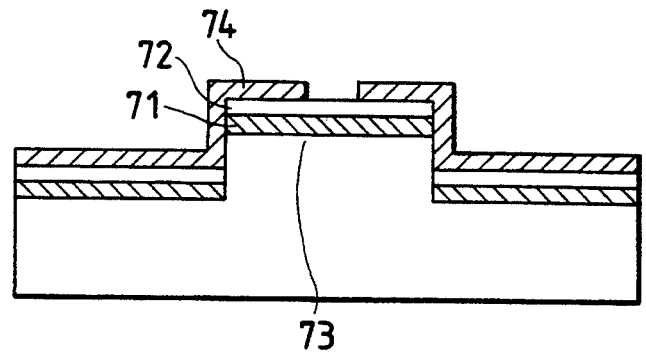
Figure 7C:
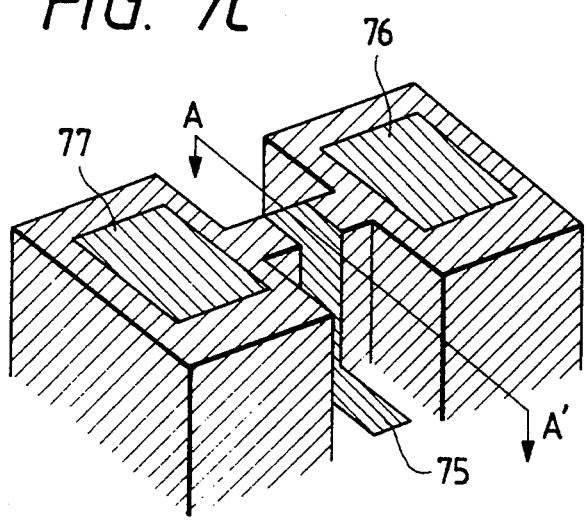

First, a case where a MODFET was fabricated using an $Si_{1-x}Ge_x$/Si heterostructure grown through crystallization according to a method of the present invention. A substrate with projections is formed by forming an Si (100) substrate 70 into a mesa type as shown in FIG. 7a by photolithography and dry etching technique. Here, the area of the mesa top 73 used as the active area was set to $4 \times 1$ μm² so that no misfit dislocation is produced in the layer to be formed thereon and the height was set to approximately 1 μm. After cleaning the substrate, an $Si_{0.7}Ge_{0.3}$ channel layer 71 with a thickness of 20 nm and a p-type Si doping layer 72 with a thickness of 30 nm were formed as shown in FIG. 7b by molecular beam epitaxy with the substrate temperature kept at 500° C. Then, an $SiO_2$ film 74 was deposited for the purpose of protection by a CVD method. In succession thereto, a Ti gate electrode 75, an AuGa source electrode 76, and an AuGa source electrode 77 were deposited as shown in FIG. 7c by vacuum evaporation. The product in process was then subjected to an alloying heat treatment in an nitrogen atmosphere at a temperature of 360° C. for 60 seconds. The sectional view taken along line A—A' in FIG. 7c corresponds to FIG. 7b.

When a Hall effect measurement was performed on an element with the heterostructure of the present embodiment, the hole sheet density was $Ns = 3-4 \times 10^{12}/cm^2$ and the hole mobility was 5000–7000 cm²/Vs at a temperature of 77K. Thus, it is found that greatly improved values over those in elements of the prior-art structure were obtained. From the fact that such a high hole sheet density is obtained, it is presumed that a great band discontinuity is formed in the hetero-interface. Further, when the field effect mobility of the MODFET was measured, a value comparable to the hole mobility was obtained.

EMBODIMENT 2

Figure 8A:
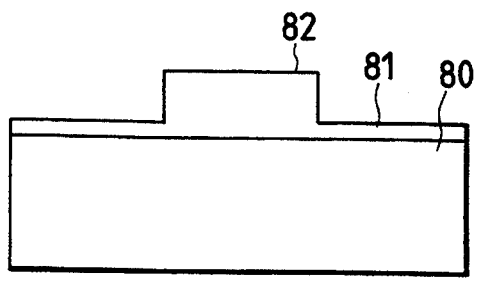
FIG. 8a to FIG. 8e are sectional views of an SiGe HBT according to the present invention in the course of its fabrication.
Figure 8B:
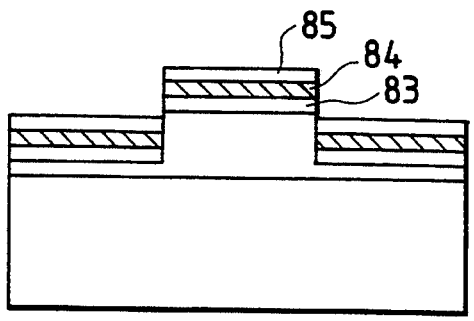
Figure 8C:
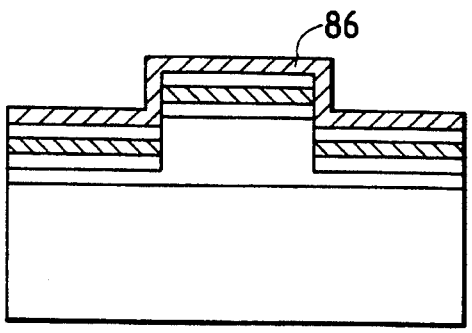
Figure 8D:
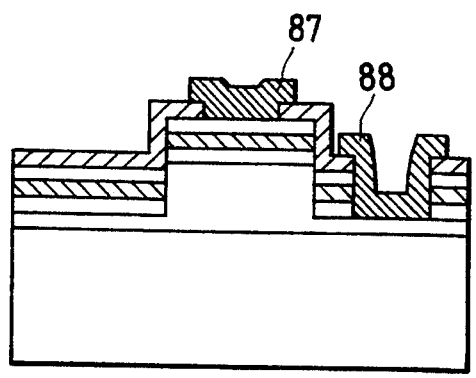
Figure 8E:
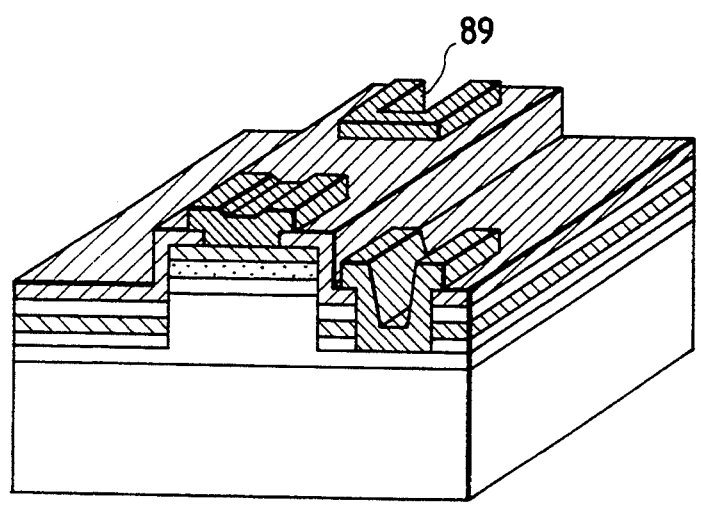

Now, an example where an HBT was formed using an $Si_{1-x}Ge_x$ alloy film for the base material will be described. First, an Si substrate 80 with a high-density n-type epitaxial layer 81 deposited thereon was formed into a mesa type as shown in FIG. 8a by photolithography and dry etching technique. The area of the mesa top 82 was set to $2 \times 2$ μm² and its height was set to approximately 1 μm. Thereafter, as shown in FIG. 8b, an n-type Si layer 83 with a thickness of 100 nm, a p-type $Si_{0.65}Ge_{0.35}$ base layer 84 (B-dope: $10^{19}/cm^3$) with a thickness of 30 nm, and an n-type Si emitter 85 (As dope: $10^{20}/cm^3$) were successively grown by molecular beam epitaxy with the substrate temperatures kept at 700° C., 500° C., and 500° C., respectively. Then, an $SiO_2$ film 86 for protection was deposited all over by CVD as shown in FIG. 8c. Thereafter, a contact hole for a collector electrode and a contact hole for a base electrode were formed as shown in FIG. 8d and FIG. 8e by etching, and Al is deposited by vacuum evaporation and thereby the emitter electrode 87, collector electrode 88, and further the base electrode 89 were formed.

The present HBT has a greater Ge content than the conventionally used SiGe base layer and, hence, a greater band discontinuity can be obtained between the base layer and the emitter layer. As a result, the emitter injection effect was increased. Even when the doping density was further raised to $2 \times 10^{19}/cm^3$, the common-emitter current gain $h_{FE}$ could be held at approximately 100 while the cut-off frequency $f_T = 80$ GHz was realized. During the fabrication of the element, though high-temperature processes such as heat treatment for the ion implantation were performed, occurrence of misfit dislocations was not observed at the $Si_{0.65}Ge_{0.35}$/Si interface and pn characteristics were also good.

When an $Si_{0.8}Ge_{0.2}$ closer to the Si substrate in lattice constants was used, the annealing temperature could be raised to around 900° C.

EMBODIMENT 3

Figure 9A:
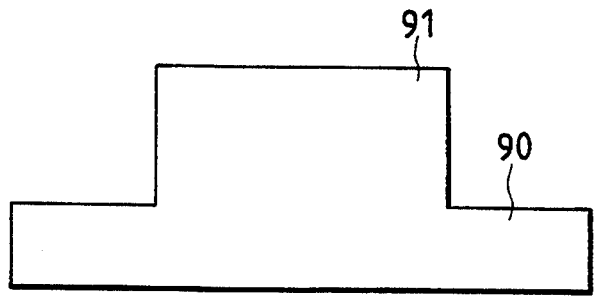
FIG. 9a to FIG. 9c are diagrams showing a fabrication process of a strain-controlled Ge channel MODFET.
Figure 9B:
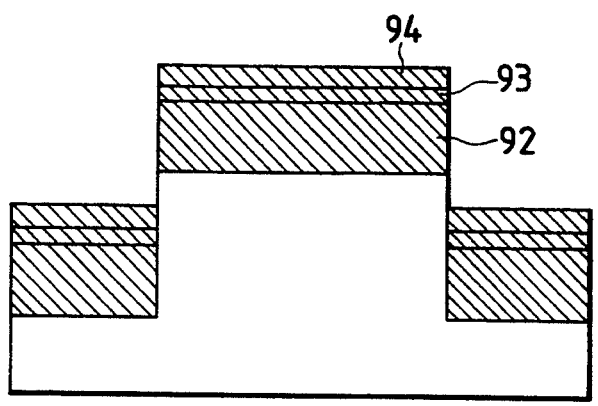
Figure 9C:
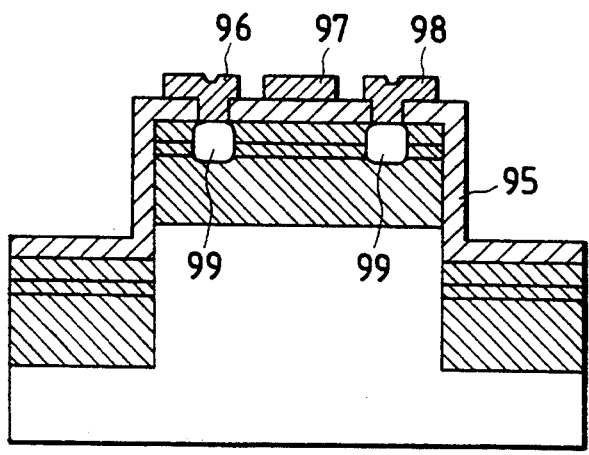

Now, application of a strain-controlled Ge channel layer to a MODFET will be described. A Ge (100) substrate 90 was formed into a mesa type as shown in FIG. 9a by photolithography and dry etching technique. Here, the area of the mesa 91 was set to $2 \times 2$ $\mu m^2$, such that occurrence of misfit dislocations in the layer formed thereon can be suppressed and strain therein can be reduced, and its height was set to approximately 3 $\mu m$. After cleaning the substrate, an $Si_{0.3}Ge_{0.7}$ buffer layer 92 with a thickness of 500 nm was grown with the substrate temperature kept at a high temperature of 450° C., a Ge channel layer 93 with a thickness of 10 nm was grown with the substrate temperature kept at 200° C., and further an $Si_{0.5}Ge_{0.5}$ doping layer 94 was formed with the substrate temperature kept at 200° C., by molecular beam epitaxy (FIG. 9b). Thereafter, an $SiO_2$ film 95 for protection was deposited all over by CVD. Then, portions of the $SiO_2$ film 95 were removed and B was implanted through the openings so that high-density p-type layers 99 were formed and, then, the source electrode 96, gate electrode 97, and drain electrode 98 were formed by vacuum evaporation of Al (FIG. 9c).

When a Hall effect measurement was performed on the element of the described structure, the hole sheet density was $5-7 \times 10^{12}/cm^2$ and the hole mobility was approximately 12000 $cm^2/Vs$ at a temperature of 77K. Thus, it is found that greatly improved values over those in elements of the prior-art structure were obtained.

EMBODIMENT 4

Now, a case where a super lattice structure was used in the buffer layer will be described. A Ge (100) substrate 90 was formed into a mesa type as shown in FIG. 9a through the same method as used for fabricating the embodiment 3. The mesa top 91 has the same area and height as that in the embodiment 3. Then, using the molecular beam epitaxy, an $Si_{0.3}Ge_{0.7}$ buffer layer was formed to a thickness of 100 nm, 10 layers of Si layers 1 nm thick and Ge layers 1 nm thick were alternately formed thereon with the substrate temperature kept at 300° C., and another $Si_{0.3}Ge_{0.7}$ buffer layer was grown thereon to a thickness of 100 nm. Thereafter, the Ge channel layer 93, $Si_{0.5}Ge_{0.5}$ doping layer 94, $SiO_2$ film 95, source electrode 96, gate electrode 97, and drain electrode 98 were formed in the same way as with the embodiment 3 and thereby an element with the structure as shown in FIG. 9c was obtained.

When a Hall effect measurement was performed on the element of the present structure, virtually the same values as the characteristics of the embodiment 3 were obtained and it is thereby found out that a buffer layer with a thin super lattice structure introduced therein can be favorably utilized.

EMBODIMENT 5

Figure 10A:
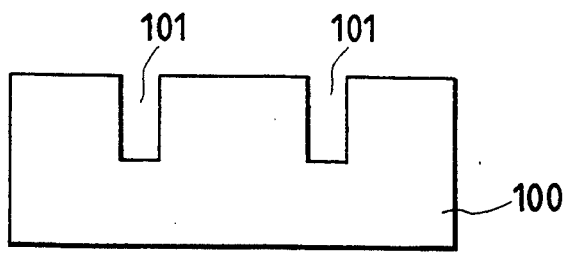
FIG. 10a to FIG. 10d are diagrams showing a fabrication process of a MODFET according to the present invention.
Figure 10B:
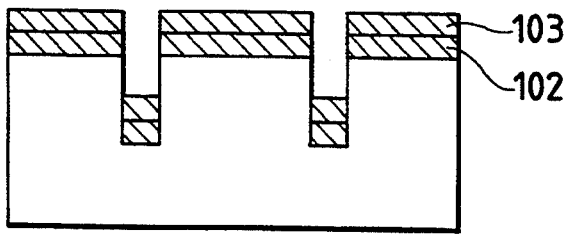
Figure 10C:
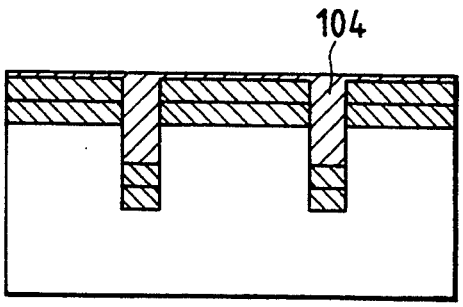
Figure 10D:
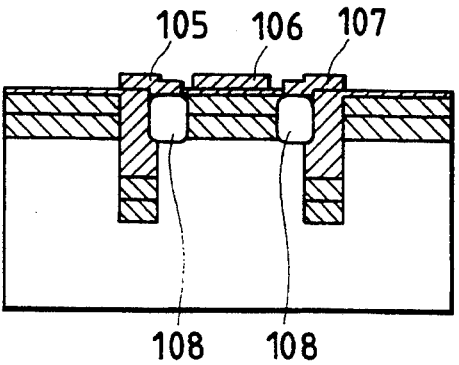

Now, an application example in which trenches used for separating elements from each other were formed in an Si substrate to provide projections and depressions for the substrate will be described. Trenches 101 for element separation were formed in an Si substrate 100 by photolithography and dry etching technique as shown in FIG. 10a. The size of the mesa formed by the trenches 101 was set to $2 \times 2$ $\mu m^2$ and the depth of the trench 101 was set to approximately 1 $\mu m$. Then, using the molecular beam epitaxy, an SiGe channel layer 102 was formed to a film thickness of 20 nm with the substrate temperature kept at 300° C. and an Si doping layer 103 was successively formed to a film thickness of 30 nm at 400° C. (FIG. 10b). Then, an $SiO_2$ film 104 was deposited to fill up the trenches (FIG. 10b). Thereafter, windows were formed at the portions where the source and drain electrodes were to be formed and $BF_2$ ions were implanted therein to form high-density p-type layers 108. Then, Al was deposited by vacuum evaporation and, thereby, the source electrode 105, drain electrode 107, and gate electrode 106 were formed (FIG. 10d).

With the described arrangement, the same effects as obtained in the embodiment 1 were obtained and MODFET elements having features suitable for use in integrated circuits such as narrow element separating areas and a planar form were realized.

EMBODIMENT 6

Figure 11A:
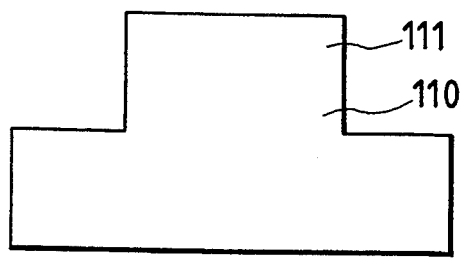
FIG. 11a to FIG. 11c are diagrams showing a fabrication process of a semiconductor laser according to the present invention.
Figure 11B:
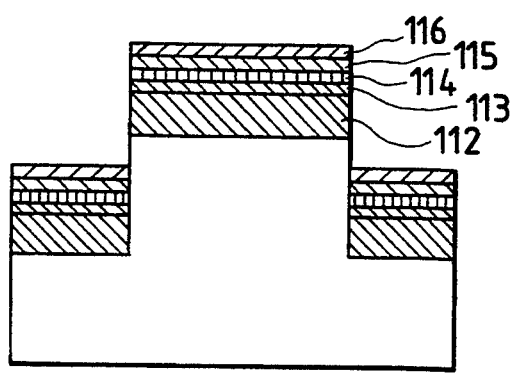
Figure 11C:
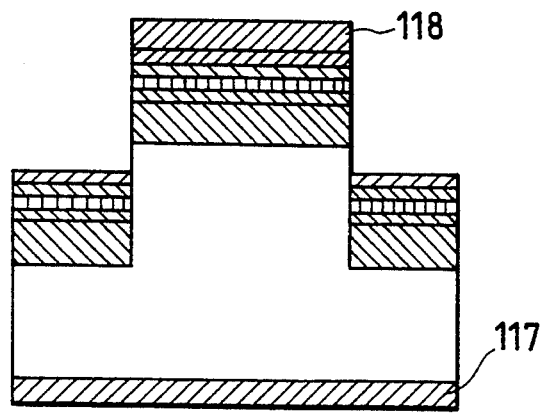

Now, an example in which an GaAs system compound semiconductor laser was formed on an Si substrate will be described. An Si substrate 110 was formed into a mesa type as shown in FIG. 11a by photolithography and dry etching technique. Here, the mesa top 111 was set to have an area of 1 $\mu m \times 1$ $\mu m$. After cleaning the substrate, a p-type GaAs layer 112 with a film thickness of 2 $\mu m$, a p-type GaAlAS layer 113 with a film thickness of 1 $\mu m$, a p-type GaAs active layer 114 with a thickness of 50 nm, an n-type GaAlAs layer 115 with a thickness of 1 $\mu m$, and an n-type GaAs layer 116 with a thickness of 0.5 $\mu m$ were formed in succession by molecular beam epitaxy (FIG. 11b). Thereafter, an AuGe electrode 117 and an AuZn electrode 118 were formed by vacuum evaporation (FIG. 11c).

As a result of investigation of lasing characteristics of the element with the described semiconductor multilayer structure, the semiconductor laser provided on the substrate formed into the mesa type was observed to lase, while the similar semiconductor laser arranged on a substrate without a mesa structure did not lase.

By using the method of the present invention, it has become possible to allow a single crystalline film having different lattice constants from those of a semiconductor crystalline substrate to epitaxially grow on the substrate without introducing dislocations therein, and thereby, it has become possible to obtain a semiconductor device making use of meritorious effects produced by the band discontinuity and stress present in the hetero-interface on electronic properties of the grown film.

What is claimed is:
1. A semiconductor device comprising:
   a) a semiconductor crystalline substrate having a plurality of projections each projection having an area of 0.01 μm² to 4 μm² or having a plurality of stripe projections each stripe projection having a width of 0.01 μm to 1 μm; and b) a semiconductor crystalline layer formed on each of said plurality of projections, said layer having different lattice constants from those of said semiconductor crystalline substrate.

2. A semiconductor device according to claim 1, wherein a difference between the lattice constants of said semiconductor crystalline layer and said semiconductor crystalline substrate equals 0.5% or more.

3. A semiconductor device according to claim 1, wherein said semiconductor crystalline layer has a super lattice structure formed of semiconductors of two or more kinds.

4. A semiconductor device according to claim 3, wherein a difference between the average values of the lattice constants of the semiconductors of two or more kinds forming the super lattice structure and the lattice constants of said semiconductor crystalline substrate equals 0.5% or more.

5. A semiconductor device according to claim 1, wherein said projection has a gate electrode formed thereon for controlling a two-dimensional carrier gas stored in a band discontinuity in a hetero-interface of heterostructure formed on said projection, and said projection constitutes an active region of a modulation dope field effect transistor.

6. A semiconductor device according to claim 1, wherein a hetero-interface of heterostructure formed on said projection constitutes a blocking layer of a heterojunction bipolar transistor.

7. The semiconductor device according to claim 1, wherein a thickness of the semiconductor crystalline layer is between the thickness of one atomic layer and 10 μm.

8. The semiconductor device according to claim 2, wherein a thickness of the semiconductor crystalline layer is between the thickness of one atomic later and 10 μm.

* * * * *